(12) United States Patent  
Liu

(10) Patent No.: US 8,957,792 B2  
(45) Date of Patent: Feb. 17, 2015

(54) TWO-DIMENSIONAL RUN-LENGTH LIMITED CODEC WITH PROTECTION WORDS AND METHOD FOR USING SAME

(71) Applicant: Wuhan Textile University, Wuhan, Hubei (CN)

(72) Inventor: Jibin Liu, Hubei (CN)

(73) Assignee: Wuhan Textile University, Wuhan, Hubei (CN)

( * ) Notice: Subject to any disclaimer, the term of this patent is extended or adjusted under 35 U.S.C. 154(b) by 0 days.

(21) Appl. No.: 14/094,625

(22) Filed: Dec. 2, 2013

(65) Prior Publication Data

US 2014/0104083 A1  Apr. 17, 2014

Related U.S. Application Data

(63) Continuation of application No. PCT/CN2011/084322, filed on Dec. 21, 2011.

(30) Foreign Application Priority Data

Jun. 3, 2011 (CN) .......................... 2011 1 0148840

(51) Int. Cl.
H03M 5/14 (2006.01)
H03M 7/46 (2006.01)

(52) U.S. Cl.
CPC ............ *H03M 5/145* (2013.01); *H03M 7/46* (2013.01)
USPC .......................................................... 341/59

(58) Field of Classification Search
USPC .................................................... 341/58, 59
See application file for complete search history.

(56) References Cited

U.S. PATENT DOCUMENTS 5,907,581 A * 5/1999 Ashley et al. ................. 375/242
7,116,250 B2 * 10/2006 Coene ............................. 341/68

(Continued)

FOREIGN PATENT DOCUMENTS

CN  1293868 A   5/2001
CN  1461006 A  12/2003

(Continued)

OTHER PUBLICATIONS

Krishnan et al. Read channel Modeling for Detection in Two-Dimensional Magnetic Recording Systems, IEEE Transactions on Magnetics, vol. 45, No. 10, Oct. 2009.*

(Continued)

*Primary Examiner* — Howard Williams
(74) *Attorney, Agent, or Firm* — Tim Tingkang Xia, Esq.; Morris, Manning & Martin, LLP

(57) ABSTRACT

The invention provides a two-dimensional run-length limited (RLL) (1,3) code method and apparatus. The codec comprises an encoder and a decoder comprising a data buffer and grouping module, a two-dimensional code word generating module, a two-dimensional word unit page constructing module, a two-dimensional code word write array module, and a protection word stuffing module. The five modules are sequentially connected, and send output through the protection word stuffing module to a two-dimensional data recording device. The decoder comprises a two-dimensional data buffer module, a two-dimensional word unit page constructing module, a one-dimensional data word decoding module, and a one-dimensional data stream assembly module. The five modules are sequentially connected, and send output through the one-dimensional data stream assembly module. The encoding/decoding method and apparatus can solve problems that any binary two-dimensional data array composed of 0's and 1's satisfies two-dimensional (1, 3) RLL constraints in both horizontal and vertical directions.

7 Claims, 6 Drawing Sheets

(56) References Cited

U.S. PATENT DOCUMENTS

| | | | |
|---|---|---|---|
| 7,227,117 | B1 | 6/2007 | Lackemann et al. |
| 7,692,835 | B2 * | 4/2010 | Noguchi .................. 359/21 |
| 2002/0199154 | A1 | 12/2002 | Kim |

FOREIGN PATENT DOCUMENTS

| | | |
|---|---|---|
| CN | 1560792 A | 1/2005 |
| CN | 1571027 A | 1/2005 |
| CN | 101365131 A | 2/2009 |
| CN | 101540610 A | 9/2009 |
| EP | 0856995 B1 | 9/2006 |

OTHER PUBLICATIONS

Lee, Robust Two-Dimensional Run-length Limited Codes, IEEE International Conference on Communications, 1994, ICC '94, IEEE, May 1994, INSPEC Accession No. 4869457, vol. 3 pp. 1814-1818, Conference Record.*

State Intellectual Property Office of the People's Republic of China, "International Search Report", China, Apr. 5, 2012.

State Intellectual Property Office of the People's Republic of China, "Office Action", China, Aug. 2, 2013.

* cited by examiner

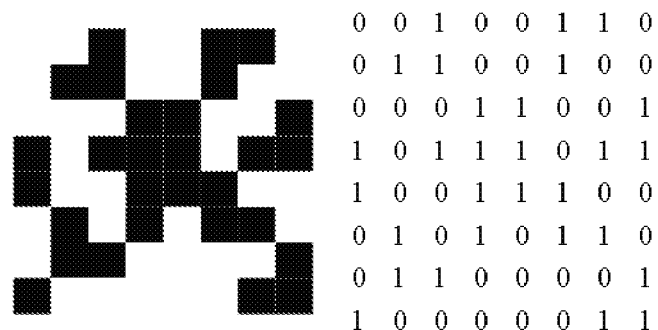
Fig. 1
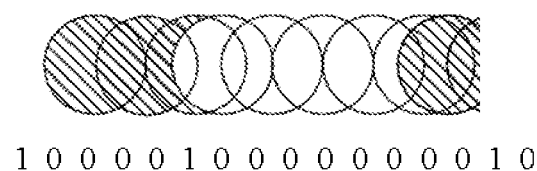
Fig. 2
0 1 0 1 0 0 0 1
0 0 1 0 0 0 1 0
0 1 0 1 0 1 0 1
1 0 1 0 1 0 0 0
0 1 0 1 0 0 0 1
0 0 1 0 1 0 1 0
0 1 0 0 0 1 0 1
1 0 1 0 1 0 0 0
Fig. 3
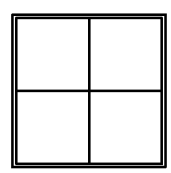
Fig. 4

| One-dimensional data word | Two-dimensional constrained code word | Two-dimensional protection word |
|---|---|---|
| 00 | 00<br>00 | 01<br>10 |
| 01 | 01<br>00 | |
| 10 | 00<br>10 | |
| 11 | 01<br>10 | |

| One-dimensional data word | Two-dimensional constrained code word | Two-dimensional protection word |
|---|---|---|
| 00 | 00<br>00 | 10<br>01 |
| 01 | 00<br>01 | |
| 10 | 10<br>00 | |
| 11 | 10<br>01 | |

TWO-DIMENSIONAL RUN-LENGTH LIMITED CODEC WITH PROTECTION WORDS AND METHOD FOR USING SAME

CROSS-REFERENCE TO RELATED APPLICATIONS

This application is a continuation application of International Patent Application No. PCT/CN2011/084322, filed Dec. 21, 2011, which itself claims the priority to Chinese Patent Application No. 201110148840.9, filed Jun. 3, 2011 in the State Intellectual Property Office of P.R. China, which are hereby incorporated herein in their entireties by reference.

FIELD OF THE INVENTION

The present invention relates to the encoding and decoding of digital data, particularly stored in two dimensional arrays in which the one-dimensional (1, 3) RLL constraints is satisfied in both horizontal and vertical dimensions, whether in horizontal or vertical direction, the run of 0's have length at least 1, and the run of 0's between two consecutive 1's have length at most 3.

BACKGROUND OF THE INVENTION

In modern storage technology and communication technology, due to its intrinsic physical feature, the channel may produce constrains in a certain form to the channel-passing signal. In order to reduce the effect of the channel on the signal, and improve the reliability of the storage system and communication system, one of the methods to solve this problem is to use limited encoding technique, wherein limited encoding is also called modulation encoding. It is represented by (d, k) run-length limited (RLL), in which d is a minimum run length and k is a maximum run length of "0" between consecutive 1's. The famous Miller Code, also known as Modified Frequency Modulation (MFM) (U.S. Pat. No. 3,108,261, issued on Oct. 22, 1963) is a typical representative. In MFM code, between adjacent 1's, the run length of "0" is at least 1, and at most 3, thus MFM code sometimes is also called one-dimensional (1, 3) RLL code.

With the development of technique, a new-type memory stored in the two-dimensional page form makes its appearance in recent years, e.g. holographic memory and two-dimensional CD. One of the greatest differences between these memories and the popular memories lies in that the data are stored on the recording medium in the two-dimensional page form for each time, and they are read also page by page. FIG. 1 is the schematic for such two-dimensional layout for data in a holographic memory.

In the above two-dimensional memory, taking FIG. 1 as the example, if the influence of boundary is not considered, the bit information for each digit will have 4 bit information which is directly adjacent to itself (usually up, down, left and right). By comparison, the data layout will be shown as FIG. 2 in the one-dimensional case.

As can be seen in FIG. 1 and FIG. 2, in two-dimensional storage, the binary data array has constraint both in horizontal and vertical directions. For this reason, the previously-mentioned Modified Frequency Modulation (MFM) will have its intrinsic constraint between data changing accordingly with the space dimension from one dimension to two dimensions, and the constraint previously satisfied under one-dimensional conditions will lose its effect under two-dimensional conditions. In this connection, it is extremely necessary to seek new two-dimensional limited encoding/decoding methods, as to ensure the data in horizontal and vertical directions both satisfying the development and demand of a new two-dimensional storage technique.

SUMMARY OF THE INVENTION

The present invention belongs to the data storage field and communication field. It particularly relates to a codec and method for using when a binary data is stored on a plane composed of rectangular lattice, whether in horizontal or vertical direction, the run of 0's have length at least 1, and the run of 0's between two consecutive 1's have length at most 3.

The technical problem to be solved by the present invention: provides a two-dimensional run-length limited codec with protection words and a method for using same, the encoding/decoding method and device of the present invention can solve the technical problem that a two-dimensional data array composed of "0" and "1" satisfies two-dimensional (1, 3) RLL constraint in two directions.

The technical proposal adopted by the present invention is the two-dimensional run-length limited codec with protection words, comprising an encoder and a decoder, and the said encoder comprises:

a data buffer and grouping module, which not only buffer-receives a one-dimensional data stream, but also divides the data into a number of groups with the same length subject to the size of the two-dimensional data page;

a two-dimensional code word generating module, which generates 2-bit one-dimensional data into 2-by-2 two-dimensional constrained code words according to the encoding and decoding rule list;

a two-dimensional word unit page constructing module, which divides a two-dimensional data page into a number of two-dimensional word unit page composed of 2-by-2 two-dimensional sub-arrays;

a two-dimensional code word write array module, which writes 2-by-2 two-dimensional limited code words into a two-dimensional data array row by row along the odd row in the diagonal direction of the two-dimensional word unit page;

a protection word filling module, which selects corresponding two-dimensional protection words in accordance with the encoding/decoding rule list selected by a two-dimensional code word generating module, and fills the two-dimensional protection words into a two-dimensional data array row by row along the even row in the diagonal direction of the two-dimensional word unit page;

The above five modules are sequentially connected and send output through the protection word filling module to a two-dimensional data recording device;

The said decoder comprises:

a two-dimensional data buffer module, which temporarily stores a two-dimensional data array read from a two-dimensional data recording device;

a two-dimensional word unit page constructing module, which divides a two-dimensional data array into a two-dimensional word unit page taking 2-by-2 two-dimensional data sub-arrays as the smallest read unit;

a one-dimensional data word decoding module, which decodes 2-by-2 two-dimensional limited code words into 2-bit one-dimensional data words according to corresponding encoding/decoding rule list;

a one-dimensional data stream assembly module, which assembles one-dimensional data word into one-dimensional data stream following the order of precedence by which it is generated;

The above five modules are sequentially connected and send output through the one-dimensional data stream assembly module.

The method of using the said two-dimensional run-length limited codec with protection words has encoding process realized through an encoder, sequentially comprising following steps:

S101) Firstly, based on the memory size of the two-dimensional data recording device, the 2N-by-2M sized two-dimensional data page is divided into a data page containing N-by-M same-sized two-dimensional data word units by taking 2-by-2 word units as a group, then the number of bits to be encoded in such data page can be determined;

S102) The data buffer and grouping module evenly divides the input binary one-dimensional data stream into a number of one-dimensional data word blocks, and the number contained in each data block equals to the data of the bit to be encoded in a data page, then the data in each block is divided into a number of one-dimensional data words by taking 2 bits as a group, and the data words are input into the data buffer for temporary storage;

S103) A data word block is read from the data buffer by the two-dimensional code word generating module, and the encoding/decoding rule list is selected to convert all one-dimensional 2-bit data words in the current data block into corresponding 2-by-2 two-dimensional constrained code words;

S104) The two-dimensional word unit page constructing module divides the two-dimensional data page into a number of two-dimensional word unit pages taking 2-by-2 two-dimensional data sub-arrays as the smallest read unit, which corresponds to the data pages resulted from Step S101;

S105) The two-dimensional code word write array module, based on the word unit row of the two-dimensional word unit page resulted from Step S104, writes 2*2 two-dimensional limited code words resulted from Step S103, along the odd row in the diagonal direction of the two-dimensional word unit page, into 2-by-2 word units in order from the upper right corner to the lower left corner, till the word unit of this row is fully written;

S106) Determine if there is any odd row in the next diagonal direction not written, if yes, back to Step S105; if all word units of the odd row in the two-directional word unit page are fully written with two-dimensional data words, then proceed to the next step;

S107) The protection word filling module selects corresponding two-dimensional protection words according to the encoding/decoding rule list selected by Step S103, and fills the words along the even row in the diagonal direction of the two-dimensional word unit page, into the word unit in order from the upper right corner to the lower left corner, till all word units of this row is fully filled;

S108) Determine if there is any even row in the next diagonal direction not filled, if yes, back to Step S107; if all two-dimensional word units of the even row are filled with two-dimensional protection words, then proceed to the next step;

S109) Determine if there is any one-dimensional data word block not encoded, if yes, back to Step S103; otherwise terminate the encoding process.

The method of using the said two-dimensional run-length limited codec with protection words mentioned in claim 1 has its decoding process realized through a decoder, sequentially comprising following steps:

S201) The two-dimensional data array read from the two-dimensional data recording device is temporarily stored in the two-dimensional data buffer module;

S202) The two-dimensional word unit page constructing module reads 2N-by-2M sized binary data array and evenly divides this two-dimensional data array taking 2-by-2 as the smallest read unit, and forms N-by-M sized two-dimensional word unit page;

S203) The one-dimensional data words decoding module, based on the word unit row of this two-dimensional word unit page, successively reads word unit data from the upper right corner to the lower left corner following the encoding order of the encoder along the odd row of the word unit page in diagonal direction, and decodes corresponding one-dimensional 2-bit data words according to the encoding/decoding list;

S204) Determine if there is any odd row in the next diagonal direction is decoded, if yes, back to Step S203; if all word units in the odd row of the two-dimensional word unit page are decodes, proceed to the next step;

S205) The one-dimensional data stream assembly module assembles the obtained one-dimensional 2-bit data words following the order of precedence by which it is decoded, and obtains corresponding one-dimensional binary data block;

S206) Determine if there is any two-dimensional data array not decoded, if yes, back to Step S202; otherwise, assemble the one-dimensional binary data block resulted from the above steps into one-dimensional data stream for output in successive order, and the decoding finishes.

The technical effects of the present invention are described as below:

1) The encoder is state-free. The number of state for the encoder is an importance index to assess its performance. The state-free encoder is the best choice to design an encoder. In the present invention, during the encoding and decoding process, data are independent in block, whether during the encoding or decoding, data are irrelevant with the adjacent data, namely the encoder is state-free.

2) The two-dimensional code word encoding/decoding rule list is constructed in an easy way. In the present invention, each 2-by-2 two-dimensional limited code word corresponds to each one-dimensional 2-bit datum. Through simple encoding/decoding rule equation, the encoding process from one-dimensional 2-bit data to 2-by-2 two-dimensional limited code words can be realized. On the contrary, the one-dimensional 2-bit data can be decoded by searching specific data bit for 2-by-2 arrays.

3) Each two-dimensional protection word corresponds to each encoding/decoding rule. In the present invention, the said two encoding/decoding rules respectively correspond to different two-dimensional protection words, that is to say, for designated encoding/decoding rule list, the required two-dimensional protection words are unique, and different encoding/decoding rules correspond to different two-dimensional protection words, which are not replaceable.

BRIEF DESCRIPTION OF THE DRAWINGS

FIG. 1 is the schematic of two-dimensional data recording format (holographic memory).

FIG. 2 is the schematic of one-dimensional data CD recording format.

FIG. 3 is the schematic of two-dimensional data array that satisfies two-dimensional (1, 3) RLL constrains.

FIG. 4 is the two-dimensional word unit composed of 4 rectangular lattices.

FIG. 6 is the list for two encoding/decoding rules.

DETAILED DESCRIPTION OF THE INVENTION

Figures 5, 6A, 6B:
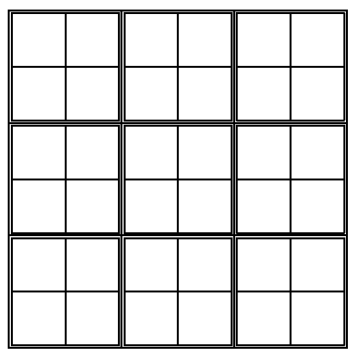
FIG. 5 is the schematic of two-dimensional array (6×6) divided into two-dimensional word unit page (3×3).
FIG. 6(a) shows the first encoding/decoding rule list.
FIG. 6(b) shows the second encoding/decoding rule list.

The present invention applies to the data memory system recording data in a two-dimensional array (i.e. page) form. The typical representative for such system includes holographic memory and two-dimensional CD and other new-type two-dimensional memories. One purpose of the present invention is to provide two encoding methods with two-dimensional run-length limited. Another purpose of the present invention is to provide two decoding methods with two-dimensional run-length limited. The further purpose of the present invention is to provide corresponding encoding and decoding device.

Against the problem proposed by the background art, the present invention has given two encoding/decoding methods with two-dimensional run-length limited, that is to say, the adoption of the encoding method given by this invention can ensure binary data array, whether in horizontal or vertical direction, the run of 0's have length at least 1, and the run of 0's between two consecutive 1's have length at most 3. We call this two-dimensional (1, 3) run-length limited code for such encoding/decoding method given by this invention as 2D-(1, 3) RLL code.

Based on the method given by this invention, due to the presence of two-dimensional protection words, the code rate for the said encoder equals to ¼ and the decoder will not generate error propagation during the decoding phase. The decoding error is only limited to one data word, i.e. 2 bits data.

For the purpose of this invention, the technical proposal adopted by this invention is the two-dimensional (1, 3) RLL constrained encoding method, including following steps:

Step 1: Firstly, divide 2N-by-2M sized two-dimensional data pages into N-by-M same sized two-dimensional word unit pages by taking 2-by-2 subarray as a group, then turn to Step 2;

Step 2: evenly divide the input binary data stream into a number of blocks with the count equal to the page size, then divide the data in each block into a number of one-dimensional data words sized 2 by taking two as a group, by which each word can be any one of the following 4 values: 00, 01, 10, 11, and input these one-dimensional data words into the data buffer pool for temporary storage, turn to Step 3;

Step 3: read one-dimensional data words from the buffer pool, and encode the current one-dimensional data words as per the encoding/decoding rule list as shown in FIG. 6, and convert into 2-by-2 two-dimensional constrained code words, then taking the word unit as the basis for this 2-by-2 two-dimensional constrained code words, along the odd row of the two-dimensional word unit page in diagonal direction, write this 2-by-2 two-dimensional limited code words from upper right corner to lower left corner in order into 2-by-2-sized word units, turn to Step 4;

Step 4: repeat Step 3, till all word units in odd rows are fully written with 2-by-2 two-dimensional constrained code words; turn to Step 5;

Step 5: along the even rows of the two-dimensional word unit page in diagonal direction, from the upper right corner to the lower right corner, fill the two-dimensional protection words corresponding to the encoding/decoding rule list selected by Step 3 into the word unit, till the word unit of this row is filled up;

Step 6: repeat Step 5, till the encoding finishes.

The decoding steps are as below:

Step 1: read 2N-by-2M-sized binary data array, evenly divide data array in 2-by-2 two-dimensional sub-array form, form N-by-M sized two-dimensional word unit page by taking 2-by-2 data as the basic read unit;

Step 2: along the diagonal direction of N-by-M two-dimensional word unit page, from the upper right corner to the lower left corner, read two-dimensional word unit data of odd rows in order, and decode corresponding 2-bits one-dimensional data words according to the encoding/decoding rule list selected during the encoding process;

Step 3: repeat Step 2, till the two-dimensional array finishes decoding; Step 4: assemble the 2-bit one-dimensional data words resulted from Step 2 following the order by which it is decoded and generate corresponding one-dimensional binary data block, turn to Step 5;

Step 5: determine whether to input next 2N-by-2M two-dimensional data array, if yes, turn to Step 1; otherwise assemble the one-dimensional binary data block resulted from above steps in order of precedence into one-dimensional data stream and output, and the decoding is completed.

Figure 7:
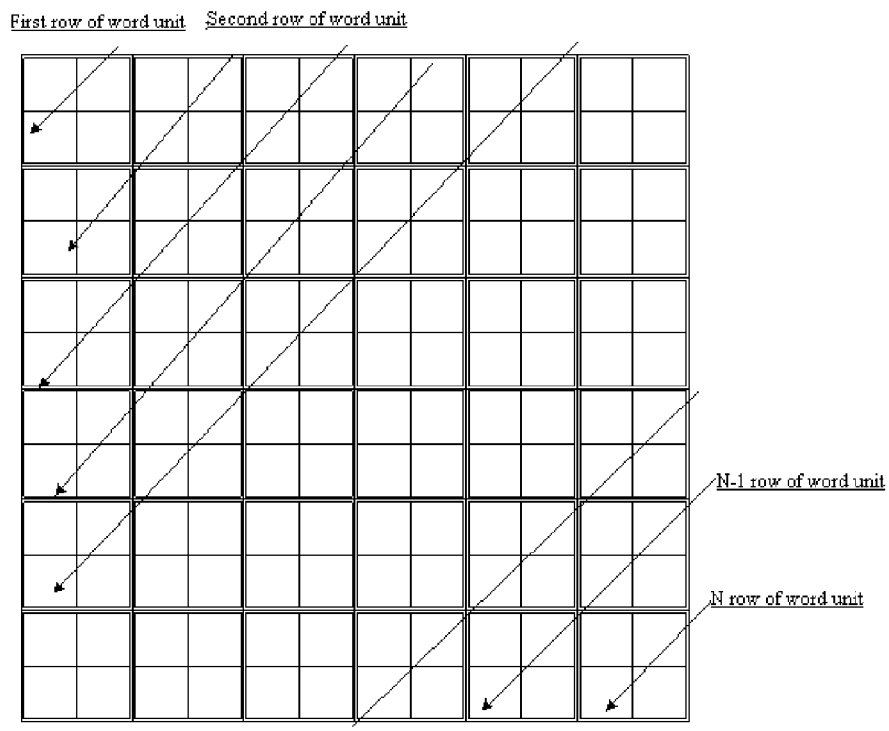
FIG. 7 is the schematic of two-dimensional word unit row serial number.

For the purpose of this invention, the invention also provides an encoder realizing above data encoding method, comprising:

a data buffer and grouping module, which not only buffers a one-dimensional data stream, but also divides the data into a number of one-dimensional data groups with the same length subject to the size of the two-dimensional array;

a two-dimensional code word generating module, which generates corresponding two-dimensional constrained code word according to the encoding and decoding rule list described in FIG. 6 and inputs into the two-dimensional word unit module;

a two-dimensional word unit page constructing module, which divides a two-dimensional data page into a number of two-dimensional word unit page composed of 2-by-2 two-dimensional sub-arrays;

a two-dimensional code word write array module, which writes 2-by-2 two-dimensional constrained code words into a two-dimensional data array row by row along the odd row in the diagonal direction of the two-dimensional word unit page;

a protection word filling module, which selects corresponding protection words in accordance with the encoding/decoding rule list described in FIG. 6 and the encoding/decoding rule list selected by the above two-dimensional code word generating module, and fills the two-dimensional protection words into 2N-by-2M two-dimensional data array row by row along the even row in the diagonal direction of the two-dimensional word unit page, from the upper right corner to the lower left corner, as shown in FIG. 7;

For the purpose of this invention, the invention also provides a decoder realizing above data decoding method, comprising:

a two-dimensional data buffer module, which is mainly used to temporarily store a two-dimensional data array read from a two-dimensional data recording device;

a two-dimensional word unit page constructing module, which is mainly used to divide 2N-by-2M two-dimensional data array into N-by-M two-dimensional word unit page taking 2-by-2 data as the smallest read unit;

a one-dimensional data words decoding module, which is mainly used to decode 2-by-2 two-dimensional word units into 2-bit one-dimensional data word according to corresponding encoding/decoding rule list;

a one-dimensional data stream assembly module, which is mainly used to assemble 2-bits one-dimensional data word into one-dimensional data stream following the order of precedence by which it is generated;

In brief, this invention can convert one-dimensional data stream into two-dimensional data array that satisfies parameter-specific run-length constraint. The said two-dimensional run-length constrained encoding method comprises dividing the input data into groups with specific size; then 2-bits one-dimensional data words are converted into 2-by-2 two-dimensional constrained code words in accordance with corresponding encoding rules; finally the generated 2-by-2 two-dimensional constrained code words and corresponding two-dimensional protection words are written as per pre-designated method, as to achieve that the above-mentioned two-dimensional data array composed of data "0" and "1" satisfies constraint both in horizontal and vertical directions, that is to say, the run-length of data "0" satisfies the requirement of at least 1 and at most 3 whether in horizontal or vertical direction. This invention is designed with two encoding/decoding rules and corresponding codec, having the code rate for two encoders equal to ¼. The codec given by this invention is a state-free encoder, thus catastrophic propagation of error codes incurred due to decoding mistake will not happen, that is to say, the decoding mistake of current data will not bring any adverse effect to the decoding of subsequent data, and the decoding mistake is only limited to the current 2-bits data.

The present invention is further described below combined with figures and embodiments:

As shown in FIG. 3, it describes a two-dimensional data array produced by this invention, whether in horizontal or vertical direction, having its run-length of data "0" between adjacent data "1" satisfying the constraint of at least 1 and at most 3.

As shown in FIG. 4, a two-dimensional word unit composed of 2-by-2 rectangular lattices is the basic unit data of encoding/decoding two-dimensional array.

As shown in FIG. 5, the 6-by-6-sized two-dimensional arrays are converted into 3-by-3-sized two-dimensional word unit pages, by which the one-dimensional data stream can be written into the two-dimensional data array satisfying 2D-(1, 3) RLL constraint.

As shown in FIG. 6, FIG. 6 (a) gives the first encoding/decoding rule list and corresponding protection words. In this encoding/decoding rule, four data as 00, 01, 10 and 11 are respectively replaced with two-dimensional constrained code words sized 2-by-2, and during the encoding process, in order to satisfy the corresponding constraint, a special two-dimensional array is needed to protect these four two-dimensional constrained code words. This special two-dimensional array is called two-dimensional protection word. In the first encoding rule, this two-dimensional protection word is 01
10.

As shown in FIG. 6 (a), in this encoding/decoding rule list, one-dimensional data word is expressed by X=[$X_1$ $X_2$], and the two-dimensional limited code word is shown as below:

$$Y = \begin{bmatrix} Y_{11} & Y_{12} \\ Y_{21} & Y_{22} \end{bmatrix}.$$

Based on this encoding/decoding rule list, the corresponding encoding equation for the two-dimensional limited code word is shown as below:

$$Y = \begin{bmatrix} Y_{11} & Y_{12} \\ Y_{21} & Y_{22} \end{bmatrix} = \begin{bmatrix} 0 & X_2 \\ X_1 & 0 \end{bmatrix}$$

Wherein, X1~X2 stand for each bit of one-dimensional data words. Y11~Y22 stand for each bit of two-dimensional constrained code words. Based on such encoding/decoding rule list, one-dimensional 2-bit data can be converted into 2-by-2 two-dimensional constrained code words. On the contrary, during the decoding process, the decoding equation for one-dimensional 2-bit data words according to this encoding/decoding rule list is shown as below: $X_1=Y_{21}$; $X_2=Y_{12}$.

FIG. 6 (b) gives the second encoding/decoding rule list and in this encoding rule, the two-dimensional protection word is 10
01.

Based on this encoding/decoding rule list, the corresponding encoding equation for the two-dimensional constrained code word is shown as below:

$$Y = \begin{bmatrix} Y_{11} & Y_{12} \\ Y_{21} & Y_{22} \end{bmatrix} = \begin{bmatrix} X_1 & 0 \\ 0 & X_2 \end{bmatrix}.$$

The decoding equation given in FIG. 6 (b) for the one-dimensional 2-bit data word is shown as below: $X_1=Y_{11}$; $X_2=Y_{22}$.

As shown in FIG. 7, in the construction of two-dimensional limited array, the word unit row serial number is the precedence order of two-dimensional data input, that is to say, firstly 2-by-2 two-dimensional data are input in the first row of the word unit and by this order, till 2-by-2 two-dimensional data are input in the final row, and here the final row for the two-dimensional data word unit page is described by N row of word unit.

Figure 8:
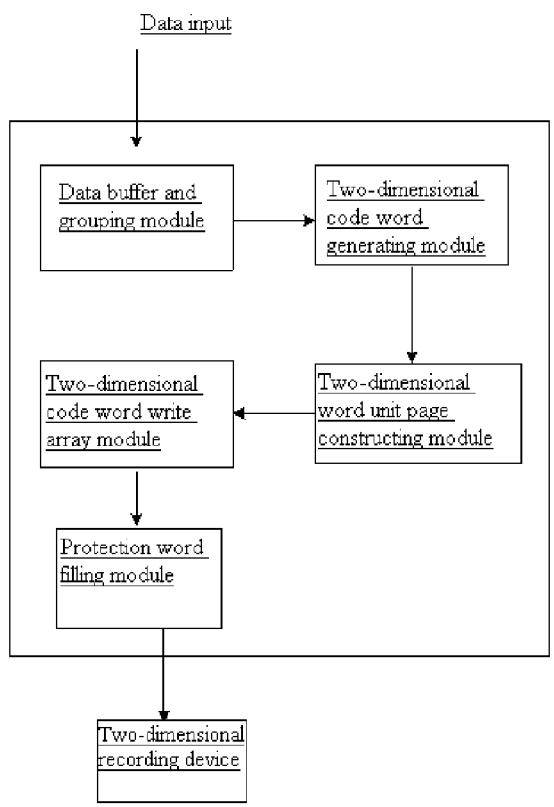
FIG. 8 is the functional block diagram of an encoder.

As shown in FIG. 8, the encoder is encoded in the following process: firstly, the initial one-dimensional data stream is input into the data buffer and grouping module. This module not only buffers the one-dimensional data stream, but also divides the data into a number of groups with the same length subject to the size of the two-dimensional array; after the one-dimensional data passing through the grouping module, firstly input the grouping data into the two-dimensional code word generating module, then corresponding two-dimensional constrained code words are generated according to the encoding rule list described in FIG. 6, and input into the two-dimensional word unit module. Here, the two-dimensional unit page constructing module divides 2N-by-2M two-dimensional arrays into a number of N-by-M two-dimensional word unit pages composed of 2-by-2 array. The generation of two-dimensional data arrays are completed by the two-dimensional code word write array module. The two-dimensional code word write array module writes two-dimensional constrained code words generated by the two-dimensional code word generating module into the two-dimensional data arrays row by row along the odd row in the diagonal direction of the two-dimensional word unit page, from upper right corner to lower left corner, as shown in FIG. 7. The protection word filling module selects corresponding two-dimensional protection words in accordance with the encoding/decoding rule list selected during the encoding process, and fills the two-dimensional protection words into a two-dimensional data array row by row along the even row in the diagonal direction of the two-dimensional word unit page as shown in FIG. 7, thereby realizing the conversion of one-dimensional data stream into two-dimensional constrained arrays. Its encoding steps comprise:

(1) grouping the input data stream of any length subject to the size of the two-dimensional array;

(2) dividing the one-dimensional data groups in Step (1) into a number of one-dimensional data words by taking 2-bits as one word; then encode 2-bits one-dimensional data words into 2-by-2 two-dimensional constrained code words in accordance with the encoding/decoding rule list mentioned in FIG. 6;

(3) taking 2-by-2 array as one word unit, dividing the two-dimensional array into two-dimensional word unit page row by row by taking word unit as the smallest unit;

(4) determining if the two-dimensional arrays in Step (3) is fully divided or not, if yes, turn to Step (5), otherwise proceed with Step (3);

(5) writing the two-dimensional constrained code words resulted from Step (2) row by row along the odd rows in diagonal direction of the two-dimensional word unit page, and filling the corresponding two-dimensional protection words row by row along the even rows in diagonal direction of the two-dimensional word unit page;

(6) Outputting the two-dimensional data constrained arrays resulted from Step (5) to the two-dimensional recording device.

Figure 9:
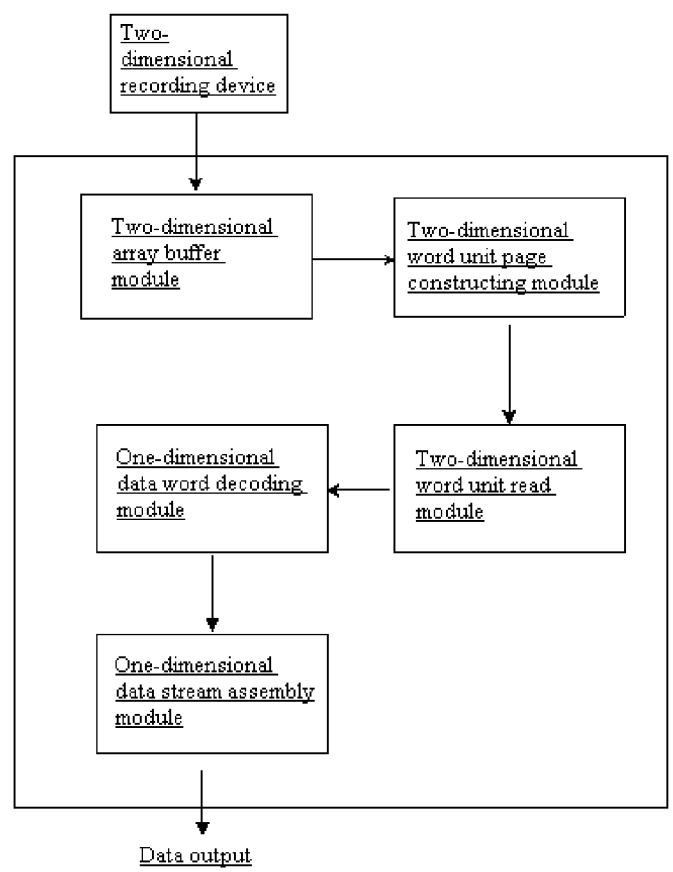
FIG. 9 is the functional block diagram of a decoder.

As shown in FIG. 9, the decoder operates in the following process: firstly, a two-dimensional data array is read from the two-dimensional recording device; then data are read page by page from the two-dimensional array buffer module, and input into the two-dimensional word unit page constructing module. By taking 2-by-2 array as one word unit, the two-dimensional data array is divided into two-dimensional word unit page, then the divided two-dimensional word unit page is input into the two-dimensional word unit read module for reading two-dimensional data words, and the two-dimensional data words are input into the one-dimensional data word decoding module, to obtain corresponding one-dimensional data words. The one-dimensional data words are input into the one-dimensional data stream assembly module, and assembled into one-dimensional initial data stream in the precedence of data words, thereby finishing the conversion of two-dimensional constrained array into one-dimensional data stream, to realize decoding process. Its decoding steps comprise:

(1) dividing the two-dimensional array into two-dimensional word unit page by taking 2-by-2 array as the basic unit;

(2) reading two-dimensional data row by row along the odd rows in diagonal direction of the word unit page;

(3) decoding 2-by-2 two-dimensional data resulted from Step (2) into 2-bit one-dimensional data words according to the encoding/decoding rule list in FIG. 6;

(4) assembling the one-dimensional data words resulted from Step (3) into one-dimensional data stream in successive order and outputting, and the decoding finishes.

Figure 10:
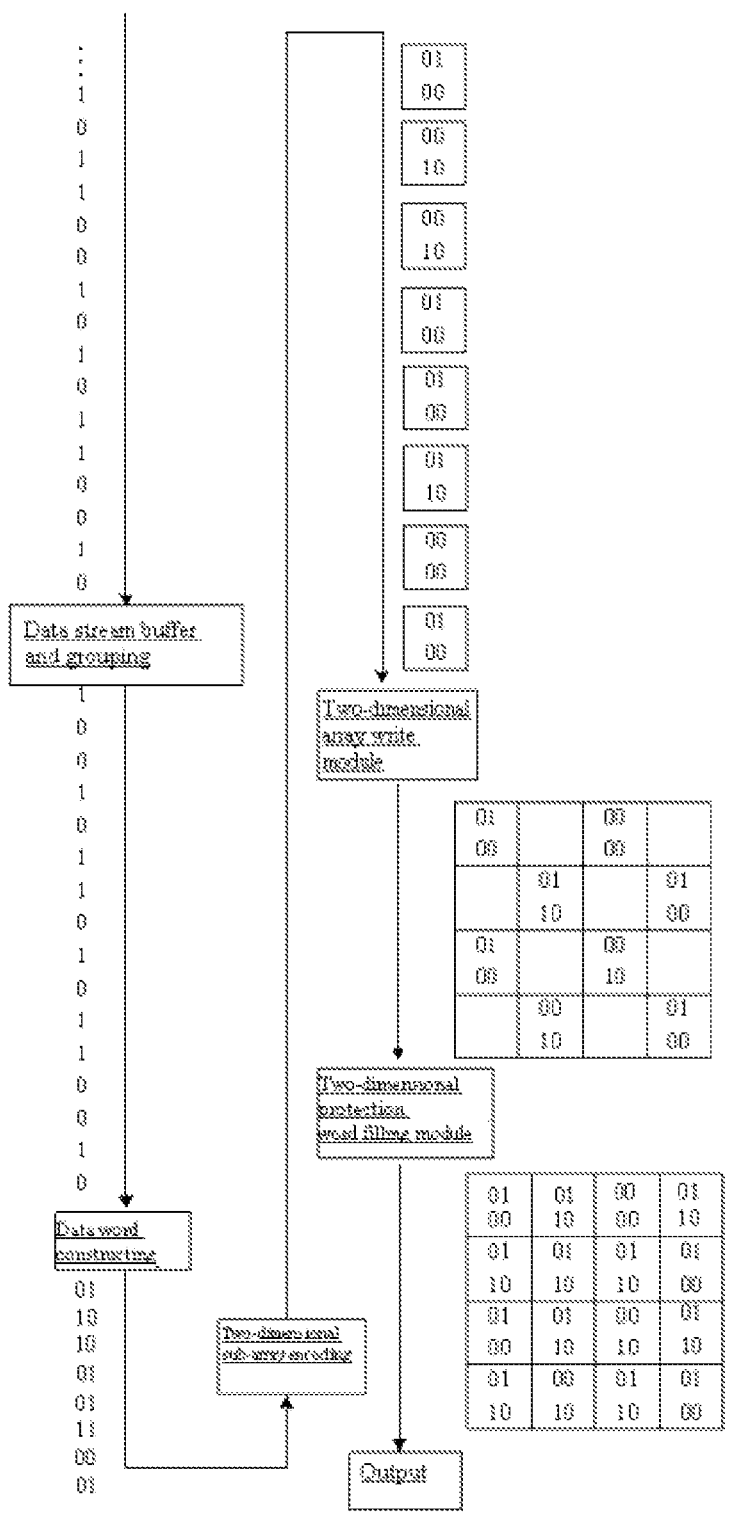
FIG. 10 is an embodiment of two-dimensional array construction based on FIG. 6 (a) encoding/decoding rule.
Figure 11:
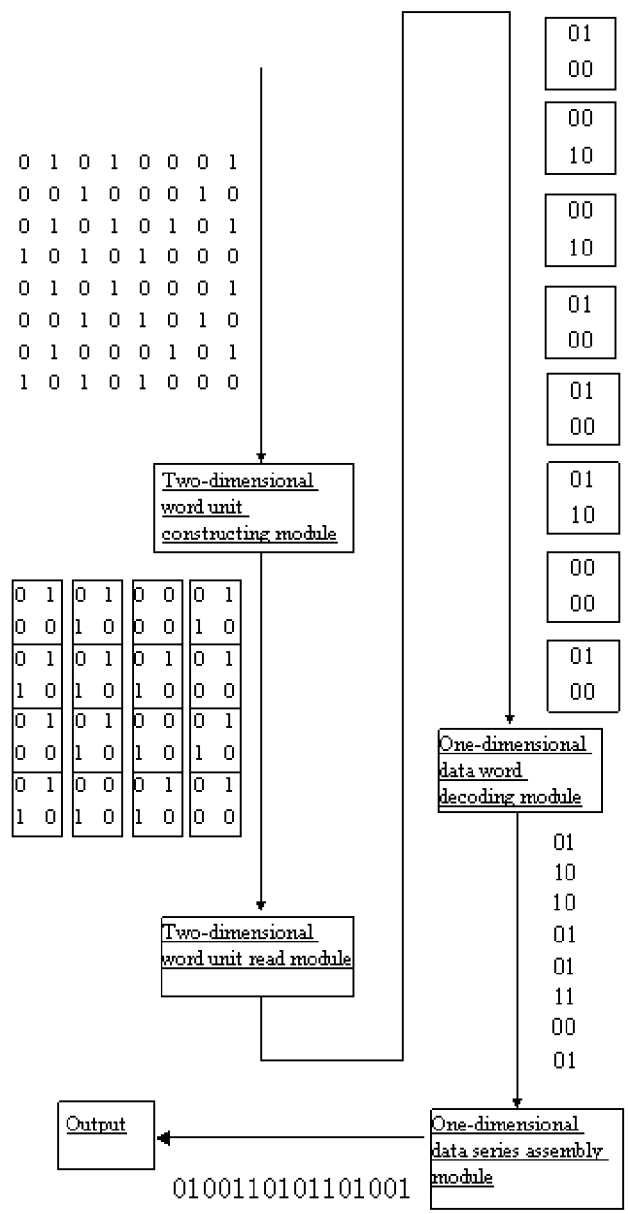
FIG. 11 is an embodiment of two-dimensional array decoding based on FIG. 6 (a) encoding/decoding rule.

In order to illustrate the application method of encoding rule, FIG. 10 and FIG. 11 give one encoding embodiment 1 and decoding embodiment 2 of the present invention. Embodiment 1 and embodiment 2 are based on the encoding/decoding rule list as described in FIG. 6 (a), and the two-dimensional array is 8-by-8-sized. If the encoding/decoding rule list as described in FIG. 6 (b) is based, its embodiment is similar.

Embodiment 1

FIG. 10 gives the detailed encoding process. Firstly, the one-dimensional data stream is divided into a number of data groups of the same length. The length of data groups is determined subject to the size of a two-dimensional array. In this embodiment, because the two-dimensional array is 8-by-8-sized, each data group include 16 bits, and these 16-bit data are divided into 8 words by taking two as one word, namely each group includes eight 2-bit words. Then these 8 one-dimensional data words are encoded in accordance with the encoding rule in FIG. 6 (a). This encoding rule is as below:

$$00 \rightarrow \genfrac{}{}{0pt}{}{00}{00}; 01 \rightarrow \genfrac{}{}{0pt}{}{01}{00}; 10 \rightarrow \genfrac{}{}{0pt}{}{00}{10}; 11 \rightarrow \genfrac{}{}{0pt}{}{01}{10}.$$

After above 8 one-dimensional data words are encoded into 8 two-dimensional limited code words sized 2-by-2, they are written into the two-dimensional array row by row along the odd rows of the two-dimensional word unit page through the two-dimensional array write module, and the written two-dimensional array is as below:

| 01 | 00 |    |    |
|----|----|----|----|
| 00 | 00 |    |    |
|    |    | 01 | 01 |
|    |    | 10 | 00 |
| 01 | 00 |    |    |
| 00 | 10 |    |    |
|    |    | 00 | 01 |
|    |    | 10 | 00 |

When the two-dimensional constrained code word is finished writing, it will be filled with two-dimensional data protection words 01
10 row by row along the even rows of the two-dimensional word unit, to obtain 8-by-8 two-dimensional data array satisfying constraint, then this constrained array are output to the two-dimensional recording device, thus to finish the two-dimensional recording of one-page user data. This two-dimensional constrained data array is as below:

| 01 | 01 | 00 | 01 |
|----|----|----|----|
| 00 | 10 | 00 | 10 |
| 01 | 01 | 01 | 01 |
| 10 | 10 | 10 | 00 |
| 01 | 01 | 00 | 01 |
| 00 | 10 | 10 | 10 |
| 01 | 00 | 01 | 01 |
| 10 | 10 | 10 | 00 |

Embodiment 2

FIG. 11 gives the detailed decoding process. Firstly, a two-dimensional data array is read from a two-dimensional recording device. In this embodiment, the 8-by-8 two-dimensional data array is as below:

```
0 1 0 1 0 0 0 1
0 0 1 0 0 0 1 0
0 1 0 1 0 1 0 1
1 0 1 0 1 0 0 0
0 1 0 1 0 0 0 1
0 0 1 0 1 0 1 0
0 1 0 0 0 1 0 1
1 0 1 0 1 0 0 0
```

Then this two-dimensional data array is horizontally divided into 4-by-4-sized two-dimensional word unit page row by row by taking 2-by-2 data sub-array as one basic unit, and the divided two-dimensional word unit page is as below:

| 0 1 | 0 1 | 0 0 | 0 1 |
|-----|-----|-----|-----|
| 0 0 | 1 0 | 0 0 | 1 0 |
| 0 1 | 0 1 | 0 1 | 0 1 |
| 1 0 | 1 0 | 1 0 | 0 0 |
| 0 1 | 0 1 | 0 0 | 0 1 |
| 0 0 | 1 0 | 1 0 | 1 0 |
| 0 1 | 0 0 | 0 1 | 0 1 |
| 1 0 | 1 0 | 1 0 | 0 0 |

Then, 2-by-2 two-dimensional data sub-arrays are read row by row along the odd rows in diagonal direction of the two-dimensional word unit page. In this embodiment, the read 2-by-2 two-dimensional data sub-arrays are decoded according to the encoding/decoding rule in FIG. 6 (a). The process is as below:

$$\frac{01}{00} \rightarrow 01; \frac{00}{00} \rightarrow 00; \frac{01}{10} \rightarrow 11; \frac{01}{00} \rightarrow 01;$$

$$\frac{01}{00} \rightarrow 01; \frac{00}{10} \rightarrow 10; \frac{00}{10} \rightarrow 10; \frac{01}{00} \rightarrow 01.$$

At last, these one-dimensional data words "01 00 11 01 01 10 10 01" are assembled into user data stream 0100110101101001 and output, thus to complete the two-dimensional decoding of user data.

Based on the encoding/decoding rule in FIG. 6 (b), similar encoding/decoding can also be finished. Although the embodiments disclosed by the present invention has been described in details, it will be understood that the present invention is not limited to the above described embodiments, and various changes, substitutions and modifications may be made without departing from the spirit and scope of two encoding/decoding rule lists and corresponding two-dimensional data protection words in FIG. 6.

What is claimed is:

1. The two-dimensional run-length limited codec with protection words is characterized by comprising an encoder and a decoder, and the encoder comprises:
    a data buffer and grouping module, which not only buffer-receives a one-dimensional data stream, but also divides the data into a number of groups with the same length subject to the size of the two-dimensional data page;
    a two-dimensional code word generating module, which generates a 2-bit one-dimensional data into 2-by-2 two-dimensional constrained code words according to the encoding and decoding rule list;
    a two-dimensional word unit page constructing module, which divides a two-dimensional data page into a number of two-dimensional word unit page composed of 2-by-2 two-dimensional sub-arrays;
    a two-dimensional code word write array module, which writes 2-by-2 two-dimensional constrained code word into a two-dimensional data array row by row along the odd row in the diagonal direction of the two-dimensional word unit page;
    a protection word stuffing module, which selects corresponding two-dimensional protection words in accordance with the encoding/decoding rule list selected by a two-dimensional code word generating module, and fills the two-dimensional protection words into a two-dimensional data array row by row along the even row in the diagonal direction of the two-dimensional word unit page;
    The above five modules are sequentially connected and send output through the protection word stuffing module to a two-dimensional data recording device;
    The decoder comprises:
    a two-dimensional data buffer module, which temporarily stores a two-dimensional data array read from a two-dimensional data recording device;
    a two-dimensional word unit page constructing module, which divides a two-dimensional data array into a two-dimensional word unit page taking 2-by-2 two-dimensional data sub-arrays as the smallest read unit;
    a one-dimensional data word decoding module, which decodes 2-by-2 two-dimensional constrained code words into 2-bit one-dimensional data word according to corresponding encoding/decoding rule list;
    a one-dimensional data stream assembly module, which assembles one-dimensional data word into one-dimensional data stream following the order of precedence by which it is generated;
    The above five modules are sequentially connected and send output through the one-dimensional data stream assembly module.

2. The method of using the two-dimensional run-length limited codec with protection words mentioned in claim 1 is characterized by realizing encoding process through an encoder, sequentially comprising following steps:
    S101) Firstly, based on the memory size of the two-dimensional data recording device, the 2N-by-2M-sized two-dimensional data page is divided into a data page containing N-by-M same-sized two-dimensional data word units by taking 2-by-2 word units as a group, then the number of bits to be encoded in such data page can be determined;

S102) The data buffer and grouping module evenly divides the input binary one-dimensional data stream into a number of one-dimensional data blocks, and the number contained in each data block equals to the data of the bit to be encoded in a data page, then the data in each block is divided into a number of one-dimensional data words by taking 2 bits as a group, and the data words are input into the data buffer for temporary storage;

S103) A data word block is read from the data buffer by the two-dimensional code word generating module, and the encoding/decoding rule list is selected to convert all one-dimensional 2-bit data words in the current data block into corresponding 2-by-2 two-dimensional constrained code words;

S104) The two-dimensional word unit page constructing module divides the two-dimensional data page into a number of two-dimensional word unit pages taking 2-by-2 two-dimensional data sub-arrays as the smallest read unit, which corresponds to the data pages resulted from Step S101;

S105) The two-dimensional code word write array module, based on the word unit row of the two-dimensional word unit page resulted from Step S104, writes 2×2 two-dimensional constrained code words resulted from Step S103, along the odd row in the diagonal direction of the two-dimensional word unit page, into 2-by-2 word units in order from the upper right corner to the lower left corner, till the word unit of this row is fully written;

S106) Determine if there is any odd row in the next diagonal direction not written, if yes, back to Step S105; if all word units of the odd row in the two-directional word unit page are fully written with two-dimensional data words, then proceed to the next step;

S107) The protection word stuffing module selects corresponding two-dimensional protection words according to the encoding/decoding rule list selected by Step S103, and fills the words along the even row in the diagonal direction of the two-dimensional word unit page, into the word unit in order from the upper right corner to the lower left corner, till all word units of this row is fully filled;

S108) Determine if there is any even row in the next diagonal direction not filled, if yes, back to Step S107; if all two-dimensional word units of the even row are filled with two-dimensional protection words, then proceed to the next step;

S109) Determine if there is any one-dimensional data word block not encoded, if yes, back to Step S103; otherwise terminate the encoding process.

3. The method mentioned according to claim 2 is characterized in that the said encoding/decoding list is shown as below:

| One-dimensional data word | Two-dimensional constrained codeword | Two-dimensional protection word |
|---|---|---|
| 00 | 00 | 01 |
|  | 00 | 10 |
| 01 | 01 |  |
|  | 00 |  |
| 10 | 00 |  |
|  | 10 |  |

-continued

| One-dimensional data word | Two-dimensional constrained codeword | Two-dimensional protection word |
|---|---|---|
| 11 | 01 |  |
|  | 10. |  |

4. The method mentioned according to claim 2 is characterized in that the said encoding/decoding list is shown as below:

| One-dimensional data word | Two-dimensional constrained codeword | Two-dimensional protection word |
|---|---|---|
| 00 | 00 | 10 |
|  | 00 | 01 |
| 01 | 00 |  |
|  | 01 |  |
| 10 | 10 |  |
|  | 00 |  |
| 11 | 10 |  |
|  | 01. |  |

5. The method of using the two-dimensional run-length limited codec with protection words mentioned in claim 1 is characterized by realizing decoding process through a decoder, sequentially comprising following steps:

S201) The two-dimensional data array read from the two-dimensional data recording device is temporarily stored in the two-dimensional data buffer module;

S202) The two-dimensional word unit page constructing module reads 2N-by-2M-sized binary data array and evenly divides this two-dimensional data array taking 2-by-2 as the smallest read unit, and forms N-by-M sized two-dimensional word unit page;

S203) The one-dimensional data word decoding module, based on the word unit row of this two-dimensional word unit page, successively reads word unit data from the upper right corner to the lower left corner following the encoding order of the encoder along the odd row of the word unit page in diagonal direction, and decodes corresponding one-dimensional 2-bit data words according to the encoding/decoding list;

S204) Determine if there is any odd row in the next diagonal direction not decoded, if yes, back to Step S203; if all word units in the odd row of the two-dimensional word unit page are decodes, proceed to the next step;

S205) The one-dimensional data stream assembly module assembles the obtained one-dimensional 2-bit data words following the order of precedence by which it is decoded, and obtains corresponding one-dimensional binary data block;

S206) Determine if there is any two-dimensional data array not decoded, if yes, back to Step S202; otherwise, assemble the one-dimensional binary data block resulted from the above steps into one-dimensional data stream for output in successive order, and the decoding finishes.

6. The method mentioned according to claim 5 is characterized in that the said encoding/decoding list is shown as below:

| One-dimensional data word | Two-dimensional constrained codeword | Two-dimensional protection word |
|---|---|---|
| 00 | 00 | 01 |
|  | 00 | 10 |

-continued

| One-dimensional data word | Two-dimensional constrained codeword | Two-dimensional protection word |
|---|---|---|
| 01 | 01 | |
| | 00 | |
| 10 | 00 | |
| | 10 | |
| 11 | 01 | |
| | 10. | |

7. The method mentioned according to claim 5 is characterized in that the said encoding/decoding list is shown as below:

| One-dimensional data word | Two-dimensional constrained codeword | Two-dimensional protection word |
|---|---|---|
| 00 | 00 | 10 |
| | 00 | 01 |
| 01 | 00 | |
| | 01 | |
| 10 | 10 | |
| | 00 | |
| 11 | 10 | |
| | 01. | |

* * * * *